(12) United States Patent
Silverman et al.

(10) Patent No.: US 9,685,258 B2
(45) Date of Patent: Jun. 20, 2017

(54) HYBRID CARBON NANOTUBE SHIELDING FOR LIGHTWEIGHT ELECTRICAL CABLES

(71) Applicants: Northrop Grumman Systems Corporation, Falls Church, VA (US); Minnesota Wire & Cable, St. Paul, MN (US)

(72) Inventors: Edward M. Silverman, Encino, CA (US); James Grant, Redondo Beach, CA (US); Thomas Kukowski, Apple Valley, MN (US); Michael Matuszewski, Eagan, MN (US); Kevin Voigt, St. Paul, MN (US); Thomas Swanson, Chicago City, MN (US); Phillip Hayes, Torrance, CA (US)

(73) Assignees: Northrop Grumman Systems Corporation, Falls Church, VA (US); Minnesota Wine & Cable, St. Paul, MN (US)

( * ) Notice: Subject to any disclaimer, the term of this patent is extended or adjusted under 35 U.S.C. 154(b) by 318 days.

(21) Appl. No.: 13/673,063

(22) Filed: Nov. 9, 2012

(65) Prior Publication Data

US 2014/0131096 A1    May 15, 2014

(51) Int. Cl.
| | |
|---|---|
| *H01B 11/10* | (2006.01) |
| *H02G 15/02* | (2006.01) |
| *H01B 11/18* | (2006.01) |
| *H01R 9/05* | (2006.01) |
| *B82Y 99/00* | (2011.01) |

(Continued)

(52) U.S. Cl.
CPC ....... *H01B 11/1008* (2013.01); *H01B 11/183* (2013.01); *H01R 9/0518* (2013.01); *H02G 15/02* (2013.01); *B82Y 99/00* (2013.01); *H01R 24/20* (2013.01); *H01R 2103/00* (2013.01); *Y10S 977/932* (2013.01)

(58) Field of Classification Search
USPC ......... 174/34, 105 R, 113 R, 110, 47, 102 R; 205/159
See application file for complete search history.

(56) References Cited

U.S. PATENT DOCUMENTS

| | | | | | |
|---|---|---|---|---|---|
| 1,606,165 | A | * | 11/1926 | Glenn | H01B 7/04 123/633 |
| 2,403,815 | A | * | 7/1946 | Martin | H01B 7/04 174/113 R |
| 2,450,429 | A | * | 10/1948 | Henning | H01B 7/04 174/113 R |
| 3,196,382 | A | * | 7/1965 | Morello, Jr. | H01R 9/0518 174/89 |
| 4,376,920 | A | * | 3/1983 | Smith | H01B 11/10 174/105 R |
| 4,675,475 | A | * | 6/1987 | Bortner | D04C 1/06 156/172 |

(Continued)

FOREIGN PATENT DOCUMENTS

GB    EP 0624933    * 10/1994

OTHER PUBLICATIONS

Wire Processing: The Future of Wire 1 Mar. 30, 2011 1 Assembly Magazine by Austin Weber.*

(Continued)

*Primary Examiner* — Michael F McAllister
(74) *Attorney, Agent, or Firm* — Patti & Malvone Law Group, LLC

(57) ABSTRACT

A cable comprising hybrid carbon nanotube (CNT) shielding includes at least one conducting wire; at least one insulating layer covering at least one of the at least one conducting wire; a metallic foil component configured for lower frequency shielding function; and a CNT tape component configured for higher frequency shielding function.

24 Claims, 14 Drawing Sheets

(51) Int. Cl.
*H01R 103/00* (2006.01)
*H01R 24/20* (2011.01)

(56) References Cited

U.S. PATENT DOCUMENTS

| | | | | |
|---|---|---|---|---|
| 5,254,188 | A | 10/1993 | Blew et al. | |
| 6,246,006 | B1* | 6/2001 | Hardin | H01B 11/1091 174/106 R |
| 6,969,504 | B2 | 11/2005 | Smalley et al. | |
| 7,345,242 | B2* | 3/2008 | Chen | H01B 1/026 174/110 R |
| 7,413,474 | B2 | 8/2008 | Liu et al. | |
| 7,491,883 | B2* | 2/2009 | Lee | H01B 11/1808 174/28 |
| 7,932,549 | B2 | 4/2011 | Holmes et al. | |
| 2008/0254675 | A1 | 10/2008 | Lee et al. | |
| 2009/0194313 | A1* | 8/2009 | Jiang | H01B 13/0162 174/102 R |
| 2009/0196982 | A1* | 8/2009 | Jiang | H01B 13/0162 427/113 |
| 2009/0277897 | A1 | 11/2009 | Lashmore et al. | |
| 2009/0283318 | A1* | 11/2009 | Bonga | H05K 1/0243 174/350 |
| 2010/0252184 | A1 | 10/2010 | Morimoto et al. | |
| 2011/0005808 | A1 | 1/2011 | White et al. | |
| 2011/0266023 | A1* | 11/2011 | Doneker | H01B 1/04 174/105 R |

OTHER PUBLICATIONS

High-Frequency Effects in Carbon Nanotube Interconnects and Implications for On-Chip Inductor Design Kaustav Banerjee Electron Devices Meeting, 2008. IEDM 2008. IEEE International, Dec. 15, 2008.*

Nieuwoudt, Arthur et al; Predicting the Performance of Low-Loss On-Chip Inductors Realized Using Carbon Nanotube Bundles; IEEE Transactions on Electron Devices; vol. 55, No. 1; Jan. 2008; pp. 298-312.

Tsai, Jeff Tsung Hui et al; Carbon Nanotube Reinforced Conductors for Flexible Electronics; Journal of Display Technology; vol. 5, No. 6; Jun. 2009; pp. 232-235.

Li, Hong et al; High-Frequency Analysis of Carbon Nanotube Interconnects and Implications for On-Chip Inductor Design; IEEE Transactions on Election Devices; vol. 56, No. 10; Oct. 2009; pp. 2202-2214.

Harvey, Stefanie; Carbon Nanotube Technology—Q&A with TE Connectivity's Stefanie Harvey; Nov. 5, 2012; pp. 1-4; www.aerospace-technology.com/features/featurecarbon-nanotube-technology-cnt-military/.

Kukowski, Tom et al; CNT Electrical Interconnects WIKI Rev1; Sep. 12, 2012; 9:56 am; pp. 1-3; efile: I:\TomK User File\TomK 12.4.06.mo.7am\Wire\AAAWire DK ina Nutshell\CNT Electrical Interconnects WIKI Rev1.doc.

Steinhogl, W. et al; Size-dependent Resistivity of Metallic Wires in the Mesoscopic Range; Physical Review B 66, 075414; 2002; The American Physical Society; 0163-1829/2002/66(7)/075414(4); pp. 075414-1 thru 075414-4.

Li, H. et al; High-Frequency Analysis of Carbon Nanotube Interconnects and Implications for On-Chip Inductor Design; IEEE Transactions on Electron Devices; vol. 56, No. 10, Oct. 2009; 0018-9383; 2009 IEEE; pp. 2202-2214.

Schelkunoff, S.A.; Coaxial Communication Transmission Lines; Bell Tel. Labs, Inc.; Electrical Engineering; Dec. 1934; pp. 1592-1593; New York, NY.

Vance, E. F.; Coupling to Shielded Cables; 1978; John Wiley & Sons, Inc.; ISBN 0-471-04107-6; pp. 132-133.

* cited by examiner

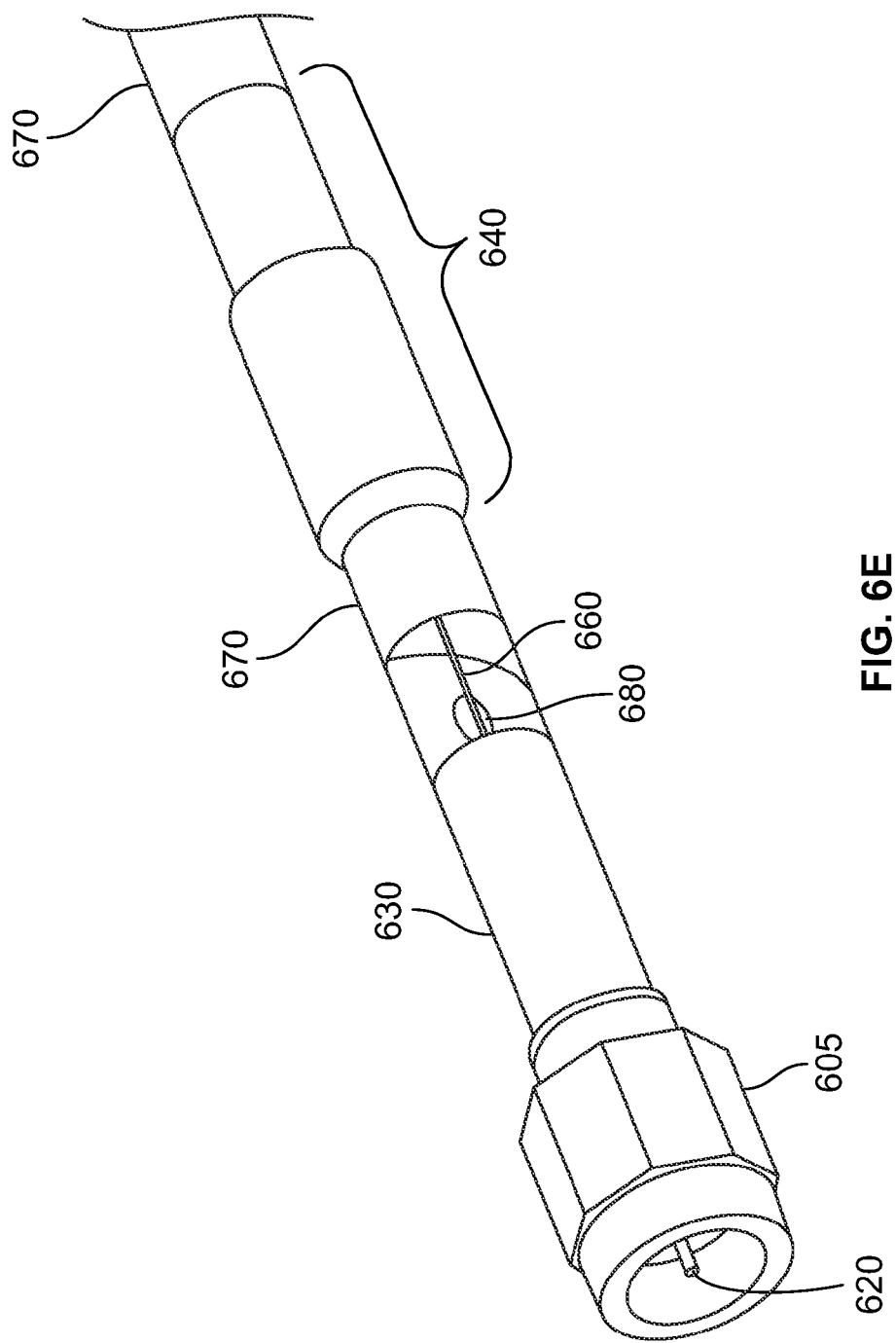

700

710 — Provide at least one coaxial cable

720 — Coat at least one insulating layer on at least one of the at least one coaxial cable

730 — Place a metallic foil component so as to surround the at least one insulating layer

740 — Place a CNT tape component so as to surround the metallic foil component

750 — Wrap a reinforcing member around at least one of the metallic foil component and the CNT tape component

760 — Crimp a connector over at least one of the CNT tape component and the metallic foil component to terminate the cable

770 — Place a glue under the crimp to hold in place at least one of the reinforcing member, the metallic foil component, and the CNT tape component

FIG. 7

HYBRID CARBON NANOTUBE SHIELDING FOR LIGHTWEIGHT ELECTRICAL CABLES

STATEMENT OF GOVERNMENT RIGHTS

The Government of the United States of America has rights in this invention pursuant to Government Contract No. 08-C-0297.

BACKGROUND

The invention relates generally to shielding and more particularly to hybrid carbon nanotube shielding for cables.

CNTs are 1-dimensional, nanometer-scale, tubular-shaped graphene molecules that exhibit ballistic semiconducting and metallic electrical conductivity properties at room temperature. CNTs have extremely small size and extremely large specific surface area. CNTs are known to have extraordinary strength, including high strain to failure and relatively high modulus. CNTs may also be highly resistant to fatigue, radiation damage, and heat.

CNTs comprise $sp^2$ covalently bonded carbon atoms in a hexagonal array and have a relatively low density of around 1,400 $kg/m^3$. Due to void volume, spun CNT yarns, braided wire and manufactured sheet products can have densities as much as ⅔ lower than this figure. CNTs may be produced as single- or multi-wall tubular structures by a variety of synthesis methods and can have a length-to-diameter aspect ratio ranging from approximately $10^2$ to $10^8$. Having such a large range of aspect ratios, CNTs may be readily assembled into strands, threads and yarns, and braided into wires and woven into fabrics much like wool or other macro-scale fibrous materials.

The key to a successful lighter weight cable involves the use of an hybrid mechanical-electrical architecture employing a metallic foil for the shielding function, i.e., shielding effectiveness, and carbon nanotube (CNT) tapes for the mechanical function, i.e., holding the foil in place, as well as secondary shielding function. FIGS. 1 and 2 show schematics of the design configurations for a typical DC cable and for a coax cable, respectively.

SUMMARY

In one set of embodiments, hybrid carbon nanotube (CNT) shielding for a cable includes at least one conducting wire; at least one insulating layer covering at least one of the at least one conducting wire; a metallic foil component configured for lower frequency shielding function; and a CNT tape component configured for higher frequency shielding function.

In another set of embodiments, a hybrid carbon nanotube (CNT) shielding for a coaxial cable includes at least one coaxial cable; at least one insulating layer covering at least one of the at least one conductor members; a metallic foil component configured for lower frequency shielding function; a CNT tape component configured for higher frequency shielding function; a reinforcing member; and a subminiature version A (SMA) connector crimped over the CNT tape component and the metallic foil component to terminate the cable, wherein silver-loaded epoxy is placed under the crimp to hold in place at least one of the reinforcing member, the metallic foil component, and the CNT tape component.

In yet another set of embodiments, hybrid carbon nanotube (CNT) shielding for a cable includes at least one conducting wire; at least one insulating layer covering at least one of the at least one conducting wire; a metallic foil component configured for lower frequency shielding function surrounding at least one insulating layer; a shielding CNT tape component configured for higher frequency shielding function surrounding the metallic foil component; and a reinforcing member wrapping at least one of the metallic foil component and the CNT tape component.

According to another set of embodiments, a method for making a coaxial cable comprising hybrid carbon nanotube (CNT) shielding includes providing at least one conducting wire; coating at least one insulating layer on at least one of the at least one conducting wire; placing a metallic foil component configured for lower frequency shielding function; placing a CNT tape component configured for higher frequency shielding function layer; wrapping a reinforcing member around at least one of the metallic foil component and the CNT tape component; crimping a connector over at least one of the CNT tape component and the metallic foil component to terminate the cable; and placing a glue under the crimp to hold in place at least one of the reinforcing member, the metallic foil component, and the CNT tape component.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

FIGS. 6A-6G are a set of illustrations showing successive stages in the sequence of terminating a coaxial cable comprising hybrid CNT shielding with an internal reinforcing member using a subminiature version A (SMA) terminator.

FIG. 7 is a flowchart of a method for making a coaxial cable comprising hybrid CNT shielding.

DETAILED DESCRIPTION

Figure 1:
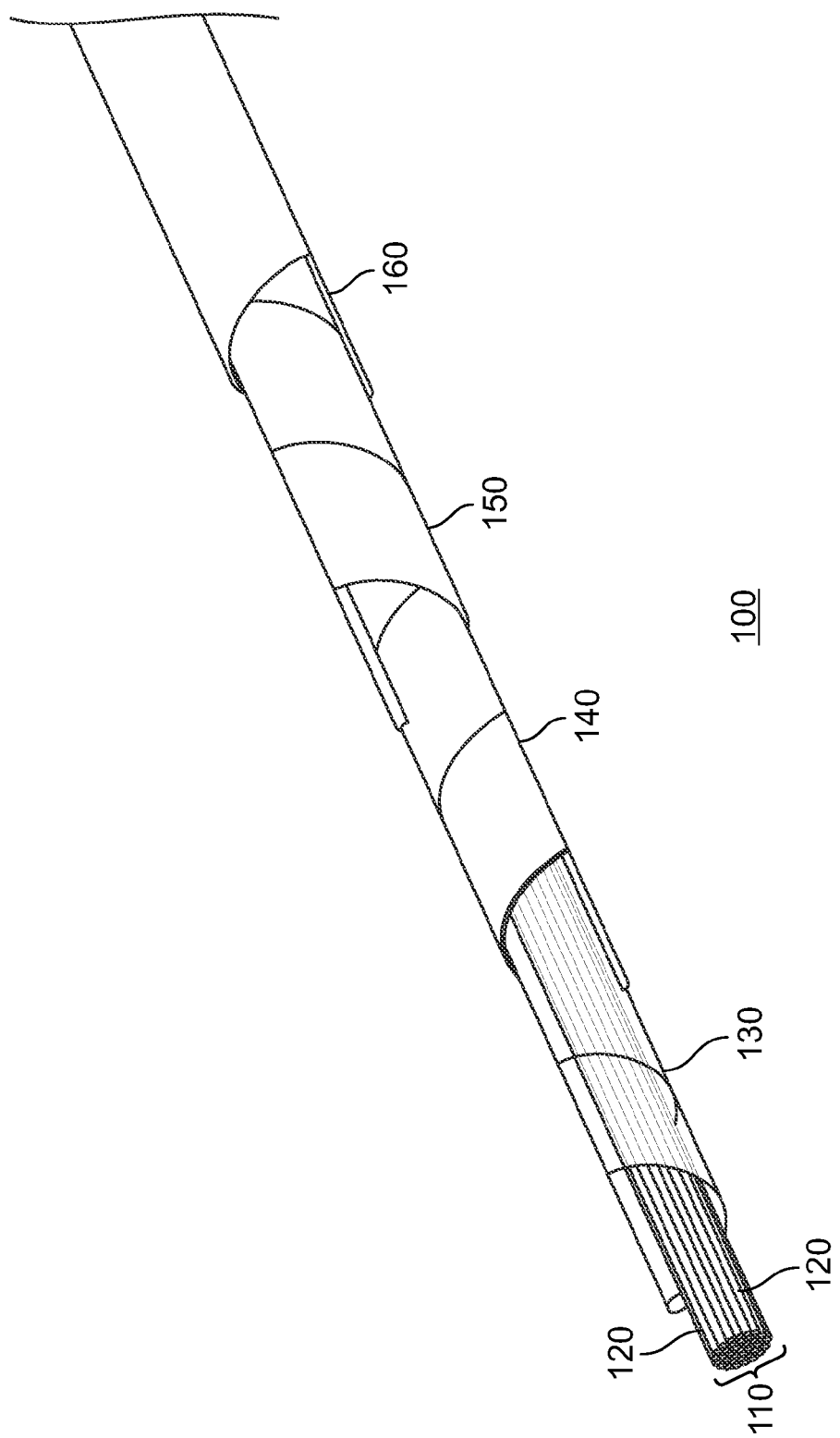
FIG. 1 is a cutaway drawing of a lightweight non-coaxial cable comprising hybrid CNT shielding.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

A coaxial cable comprising hybrid CNT shielding comprises an electrical cable including an inner conductor, an insulating layer, and an outer conducting layer, usually surrounded by a reinforcing member. The inner conductor can be, e.g., a solid or braided wire, and the outer conducting layer can, for example, be a wound foil, a woven tape, or a braid. The coaxial cable requires an internal structure of an insulating layer (i.e., a dielectric) to maintain a physical support and a constant spacing between the inner conductor and the outer conducting layer, in addition to electrically isolating the two. The reinforcing member may comprise a staycord. The reinforcing member may comprise copper braid. The reinforcing member strengthens the connection between the cable and the connector.

The coaxial cable has an inner conductor that may comprise solid or stranded wire made of silver coated copper wire. Both the solid and stranded embodiments can be flexible. The conductors for both embodiments typically comprise thin copper wires. The insulating layer, also called the dielectric, has a significant effect on the cable's properties, such as its characteristic impedance and its attenuation. The dielectric may be solid or may be perforated with air spaces. The shielding layer may be configured to ensure that a signal to be transmitted stays substantially inside the cable and that all other signals stay substantially outside the cable. That is, the shielding layer can act as a two-way signal shield. The shielding layer also can serve as a secondary conductor or ground wire. Electrically, the shielding layer establishes the function of a transmission line, which supports the delivery of high frequency signals for communications applications.

The coaxial cable can generally be applied as a high-frequency transmission line to carry a high frequency or broadband signal. Sometimes, DC power (called a bias) is added to the signal to supply the equipment at the other end, as in direct broadcast satellite receivers, with operating power. The electromagnetic field carrying the signal ideally exists only in the space between the inner conductor and conducting layer, so the coaxial cable cannot interfere with and/or suffer interference from external electromagnetic fields.

A common alternative to a coaxial cable are cable types including single and multiple conductive wires for DC signal, as well as for data communications, and power, with coax transmission included with different construction.

Our innovative concept for achieving lighter weight cables is to replace a significant fraction of the metallic braid shield component of conventional cabling with a hybrid configuration comprising thin metallic foil and lighter weight carbon nanotube, which will serve as the mechanical strengthening component for the metallic foil while providing improved shielding effectiveness at higher frequencies.

The innovative concept is to redesign the weight prohibitive copper braid component of typical cables via a lighter weight, dual-function shield construction. The design according to embodiments of the invention retains the shielding effectiveness of a cable comprising metallic foil while also comprising carbon nanotube tape, whose mechanical performance can be superior to the copper it replaces.

The shielding effectiveness according to embodiments of the invention of a combined metallic foil/CNT tape shield exceeds that of either shield component individually but offers superior electrical and mechanical performance as well as resulting in significant weight reductions. The key to a successful lighter weight cable involves the use of a hybrid mechanical-electrical architecture employing a metallic foil for the lower frequency shielding function, i.e., low-frequency shielding effectiveness (LF-SE), and carbon nanotube (CNT) tapes for the higher frequency shielding function (HF-SE) as well as superior mechanical function, i.e., holding the foil in place.

Due to the poor crimping properties exhibited by the CNT shielding tape, two different modifications are made according to embodiments of the invention to increase the strength of the connectors and of the cable comprising hybrid CNT shielding. The modifications include: 1) the addition of a reinforcing member running parallel to and substantially along the length along the cable and 2) the addition of silver loaded epoxy under the crimp to hold the shielding material and reinforcing member in place.

Table 1 shows the comparison between the strength of a commercial off the shelf (COTS) terminated coax cable and different variations of CNT modified coax RG-316.

TABLE 1

Connector Strength Data for COTS vs CNT Coax Variants

| Description | Termination Connector | Type | Reinforcing member | Conductive epoxy | Strength (lbs) Connector 1 | Connector 2 | Average | SD |
|---|---|---|---|---|---|---|---|---|
| COTS RG-316 utilizing metal shielding | SMA | Crimp | None | None | 58 | 55 | 56.5 | 2.1 |
| Modified RG-316 utilizing CNT material shielding | SMA | Crimp | None | None | 24 | 16 | 20.0 | 5.7 |
| | SMA | Crimp | Present | Present | 6 Connectorized Samples 54, 60, 54, 51, 55, 53 | | 54.5 | 3.0 |

Conventional electrical cable designs with conventional shielding for signal, control, data communications, power, and coax transmission cables used in airborne and space system applications consist of conventional heavy metals such as copper, silver and or aluminum for their current carrying capabilities and for their capability to shield radiated emissions or prevent radiated susceptability. Most cables will use different combinations of silver, copper, and aluminum for the shield components, which are typically configured as a braided design element. These applications, depending on their scale, can require hundreds to several thousand kilometers of wire and cabling and need to be light weight in order to minimize their impact on overall system performance. For typical coax cables, the weight contribution of the braid can be anywhere between 25% to 60% of the entire cable weight.

Embodiments of the disclosed invention comprise a dual-function coaxial cable shield comprising a thin metallic foil and a carbon nanotube (CNT) tape that provides mechanical strengthening as well as performance superior to the copper braid component of typical cables. The hybrid metallic/CNT shielding provides enhanced shielding and greatly reduced weight, resolving the weight-prohibitive aspects of copper braid. To resolve termination issues with carbon nanotube tape, a subminiature version A (SMA) connector is crimped over both CNT tape and foil shields to terminate the coaxial cable.

The hybrid mechanical-electrical architecture employs the metallic foil for lower frequency shielding function with effective shielding, and uses the CNT tape for higher frequency shielding function. The invention also provides superior mechanical function relative to the copper braid. Two modifications have been made to compensate for poor crimping characteristics of the CNT tape: a reinforcing member runs parallel to and alongside the length of the cable; and silver loaded epoxy is added under the crimp to hold in place the CNT tape and reinforcing member.

In summation, the shielding effectiveness of the hybrid metallic foil/CNT tape exceeds that of either individual shield component and the invention also offers superior electrical and mechanical performance as well as substantial weight reductions.

FIG. 1 is a cutaway drawing of a lightweight non-coaxial cable 100 comprising hybrid CNT shielding.

The lightweight cable 100 comprising hybrid CNT shielding comprises one or more of a single conductive wire, a multiple conductive wire, and a coaxial cable configured for one or more of information, control, power, and data communication. This example relates to one or more of a single conductive wire and a multiple conductive wire. The coaxial cable case is covered in FIG. 2.

The cable 100 comprising hybrid CNT shielding comprises a bundle 110 of DC conductors 120 or of coaxial cables 120. The bundle 110 can comprise a single DC conductor 120 or a number of stranded conductors 120. The bundle 110 is made of a conducting material, such as a metal, an alloy, a CNT bundle, or a CNT composite having electrical conduction.

Surrounding the bundle 110 of DC conductors 120 or of coaxial cables 120 is an insulating layer 130. The insulating layer 130 comprises an electric insulator or dielectric, and can be, for example, polytetrafluoroethylene (PTFE) or Perfluoroalkoxy (PFA). Surrounding the insulating layer 130 is a metallic foil component 140. The metallic foil component 140 promotes the effectiveness of shielding.

Typical DC conductors 120 would be surrounded by a silver-coated copper braid. Surrounding the metallic foil component 140 instead is a CNT tape component 150. The axes of the bundle 110 of DC conductors 120, the insulating layer 130, the metallic foil component 140, and the CNT tape component 150 are consistent, that is, these elements are coaxial. The CNT tape component 150 performs the mechanical function of helping to hold in place the metallic foil component 140 which it surrounds as well as serving as an effective conductor.

Two modifications improve the crimping properties exhibited by the CNT tape component 150, thereby increasing the strength of the bond between the connectors and the cable 100 comprising hybrid CNT shielding. The first modification comprises the addition of a reinforcing member 160 running parallel to and along the length of the cable 100 comprising hybrid CNT shielding. The reinforcing member 160 may comprise copper braid. The reinforcing member 160 may comprise a staycord. The reinforcing member strengthens the connection between the cable and the connector.

The second modification is the placing of silver loaded epoxy under the crimp so as to hold in place the CNT tape component 150 and the reinforcing member 160.

Replacing silver-coated copper braid with lighter-weight CNT tape component 150 can lead to significant weight savings.

Surrounding the CNT tape component 150 is a reinforcing member 160, which runs parallel to and preferably runs substantially along the length of the cable 100 comprising hybrid CNT shielding.

Figure 2:
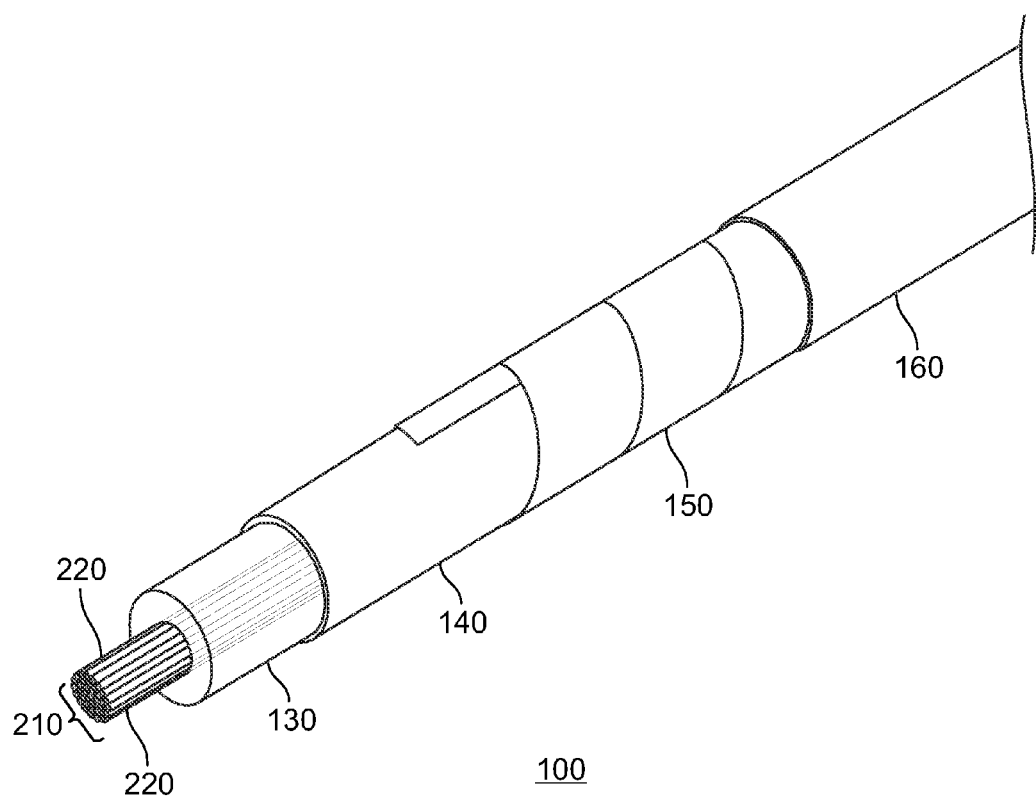
FIG. 2 is a cutaway drawing of a lightweight coaxial cable comprising hybrid CNT shielding.

FIG. 2 is a cutaway drawing of a lightweight coaxial cable 100 comprising hybrid CNT shielding.

The bundle 210 can comprise a single coaxial cable 220 or a number of stranded coaxial cables 220. The bundle 210 comprises a conducting material, such as a metal, an alloy, a CNT bundle, or a CNT composite having electrical conduction.

The cable 100 comprising hybrid CNT shielding comprises a bundle 210 of coaxial cables/220. The coaxial cables 220 are preferably electromagnetic interference (EMI) shielded cables 220. Surrounding the bundle 210 of coaxial cables/CNTs 120 is an insulating layer 130. The insulating layer 130 comprises an electric insulator or dielectric, and can be, for example, polytetrafluoroethylene (PTFE) or Perfluoroalkoxy (PFA). Surrounding the insulating layer 130 is a metallic foil component 140. The metallic foil component 140 promotes the effectiveness of shielding.

Typical coaxial cables 220 would be surrounded by a silver-coated copper braid. Surrounding the metallic foil component 140 instead is a CNT tape component 150. The axes of the bundle 210 of coaxial cables 220, the insulating layer 130, the metallic foil component 140, and the CNT tape component 150 are consistent, that is, these elements are coaxial. The CNT tape component 150 performs the mechanical function of helping to hold in place the metallic foil component 140 which it surrounds as well as serving as an effective conductor.

Two modifications improve the crimping properties exhibited by the CNT tape component 150, thereby increasing the strength of the bond between the connectors and the cable 100 comprising hybrid CNT shielding. The first modification comprises the addition of a reinforcing member 160 running parallel to and along the length of the cable 100 comprising hybrid CNT shielding. The reinforcing member 160 may comprise copper braid. The reinforcing member may comprise a staycord.

The second modification is the placing of silver loaded epoxy under the crimp so as to hold the metallic foil component 140, the CNT tape component 150, and the reinforcing member 160 in place.

Replacing the typical silver-coated copper braid with the lighter-weight CNT tape component 150 can lead to significant weight savings.

Surrounding the CNT tape component 150 is a reinforcing member 160, which runs parallel to and preferably runs substantially along the length of the cable 100 comprising hybrid CNT shielding.

Figure 3A:
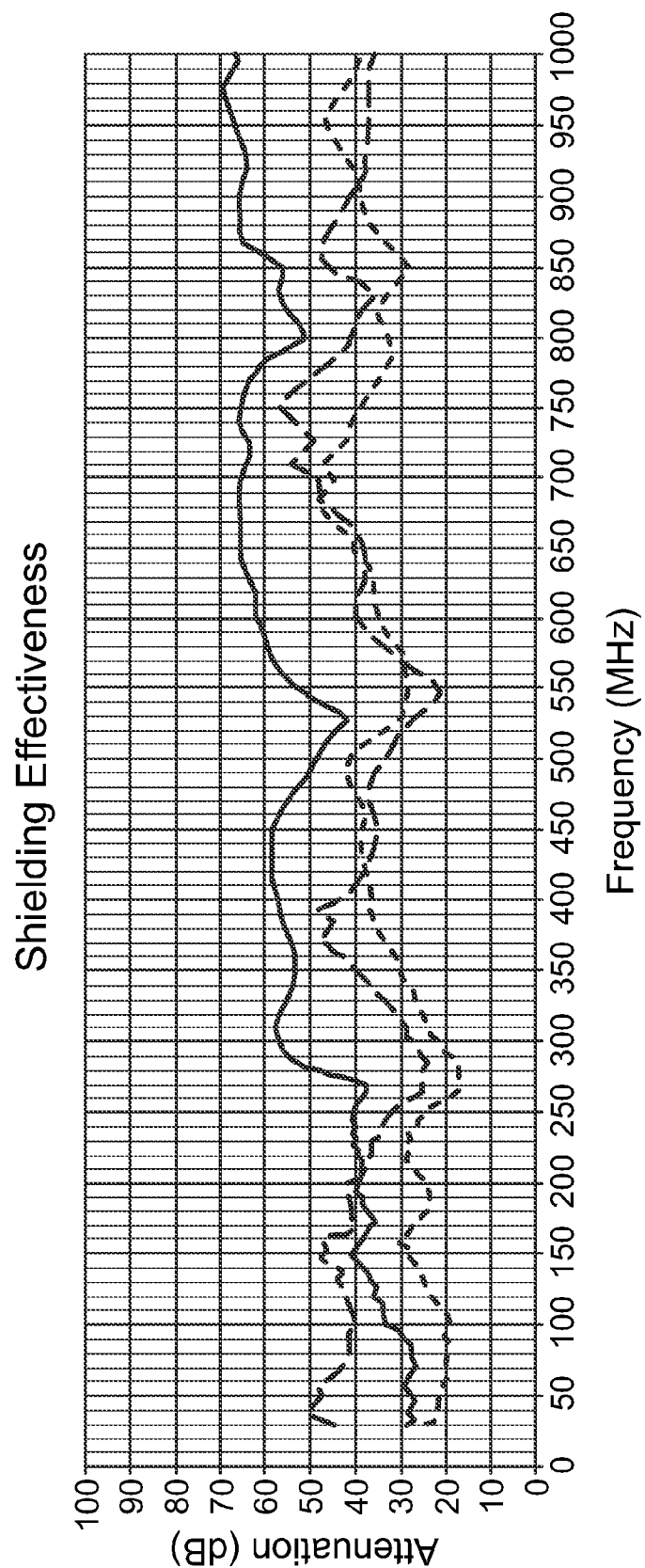
FIG. 3A is a graph of the shielding effectiveness of hybrid CNT shielding for three different DC cables: a standard copper cable, and two DC cables comprising different numbers of layers of a CNT tape component shield.

FIG. 3A is a graph of the shielding effectiveness (attenuation in decibels) as a function of frequency (in Megahertz) of hybrid CNT shielding for three different conducting 28 American Wire Gauge (AWG) twisted pairs cables: a standard cable and two DC cables comprising different numbers of layers of a CNT tape component.

More specifically, FIG. 3A is a graph of the shielding effectiveness as a function of frequency of hybrid CNT shielding for three different AWG twisted pairs cables: 1) a standard copper commercial off the shelf (COTS) cable with copper braid (line with long dashes); 2) a lightweight DC cable comprising a two-layer bromine-doped CNT tape component that runs parallel to and substantially along the length of the conducting cable (line with short dashes) and 3) a lightweight DC cable comprising an eight-layer bromine-doped CNT tape component that runs parallel to and substantially along the length of the conducting cable (solid line). Significant weight savings are thereby available.

As shown in FIG. 3A, despite the weight savings, there are disadvantages to a design wherein the DC cable 100 comprises a CNT tape component 150 that replaces the silver-coated copper braid that typically comprises standard DC cables along the entire length of the conducting cable 100. As shown in FIG. 3A, relative to a conventional cable (line with long dashes), a cable comprising eight layers of CNT tape (solid line) generally performs better in absolute terms than a prior art COTS cable, and also performs better in absolute terms than a cable comprising two layers of CNT tape (line with short dashes). Nevertheless, as can also be seen in FIG. 3A, regardless of the number of layers of CNT tape, a DC cable 100 comprising a CNT tape component 150 along its entire length experiences a shortfall in shielding effectiveness at low frequencies, i.e. at frequencies lying within the range of approximately 50 Megahertz (MHz) to approximately 200 MHz.

Figure 3B:
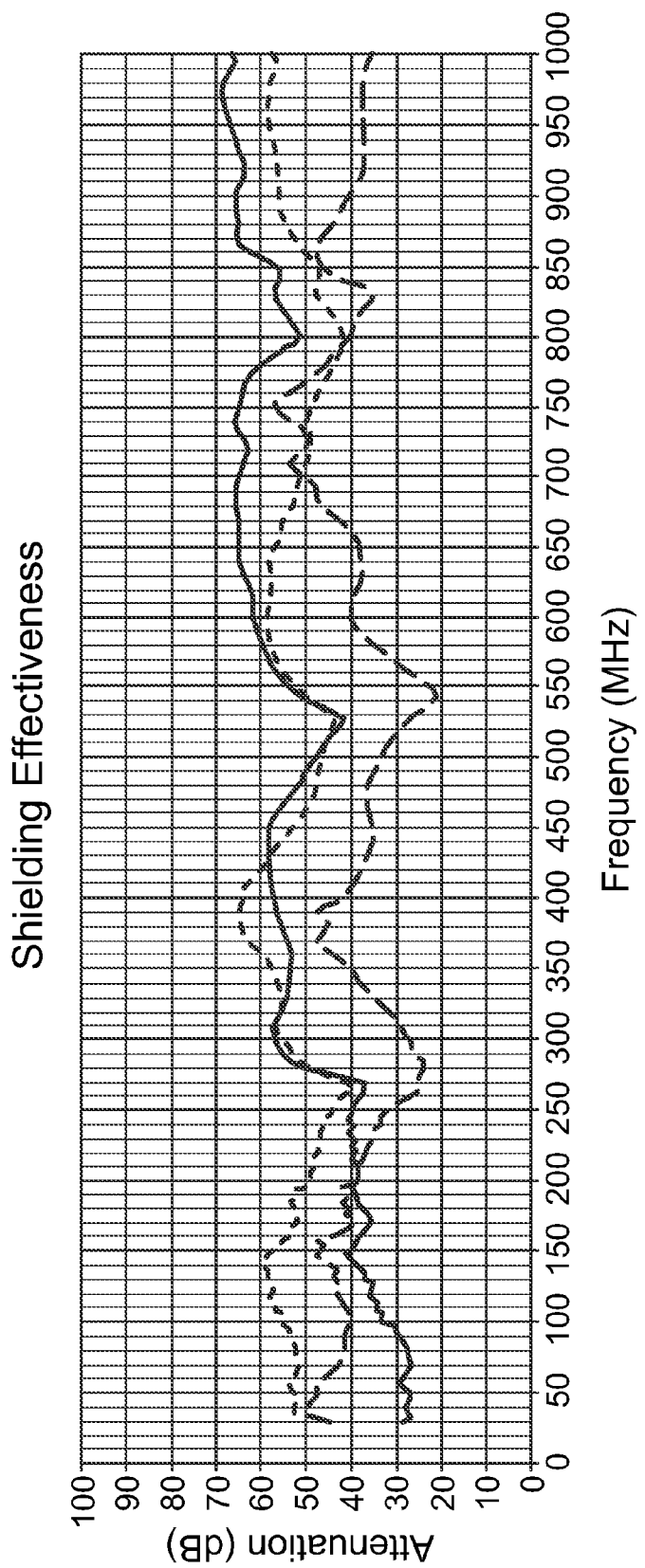
FIG. 3B is a graph of the shielding effectiveness of hybrid CNT shielding for three different DC cables: 1) a standard copper cable; 2) a DC cable comprising an eight-layer CNT tape component shield; and 3) a hybrid DC cable comprising a two-layer CNT tape component shield and a metallic foil component.

As shown in FIG. 3B, this shortfall at lower frequencies can be eliminated by creating a hybrid cable comprising hybrid CNT shielding that comprises both a CNT tape component 150 and a metallic foil component 140, according to embodiments of the invention.

FIG. 3B is a graph of the shielding effectiveness (attenuation in decibels) of hybrid CNT shielding for three different conducting 28 American Wire Gauge (AWG) twisted pairs DC cables: 1) a standard copper COTS cable with copper braid (line with long dashes); 2) a lightweight DC cable comprising an eight-layer bromine-doped CNT tape component 150 that runs parallel to and substantially along the length of the conducting cable (solid line) and 3) a lightweight hybrid DC cable comprising a two-layer bromine-doped CNT tape component 150 that runs parallel to and substantially along the length of the conducting cable and a metallic foil component comprising a single wrap of foil (line with short dashes). Only two layers of the CNT tape component 150, when combined with a single wrap of the metallic foil component 140 (line with short dashes), are sufficient to significantly outperform at low frequencies embodiments comprising eight layers of the CNT tape component 150 without the metallic foil component 140 (solid line).

The shielding effectiveness shortfall at the lower frequencies seen in FIG. 3A is not apparent when the 28 AWG COTS cable comprises a hybrid metallic foil with two layers of CNT as well as a single wrap of the metallic foil component (line with short dashes). The hybrid foil and CNT tape design has a shielding effectiveness equivalent to or better than the shielding effectiveness of the 28 AWG COTS cable. The results show that a hybrid metallic foil with CNT tape synergistically provides better shielding effectiveness than would each component separately throughout the frequency range of maximum relevance, for example, from approximately 50 MHz to approximately 1 GHz, reduced weight, and enhanced strength.

Weight is obviously a critical consideration in evaluating the performance and effectiveness of different conductors. Accordingly, the quantity known as specific shielding effectiveness provides useful information regarding shielding provided per unit weight. Specific shielding effectiveness may be defined as shielding effectiveness divided by mass density.

Figure 3C:
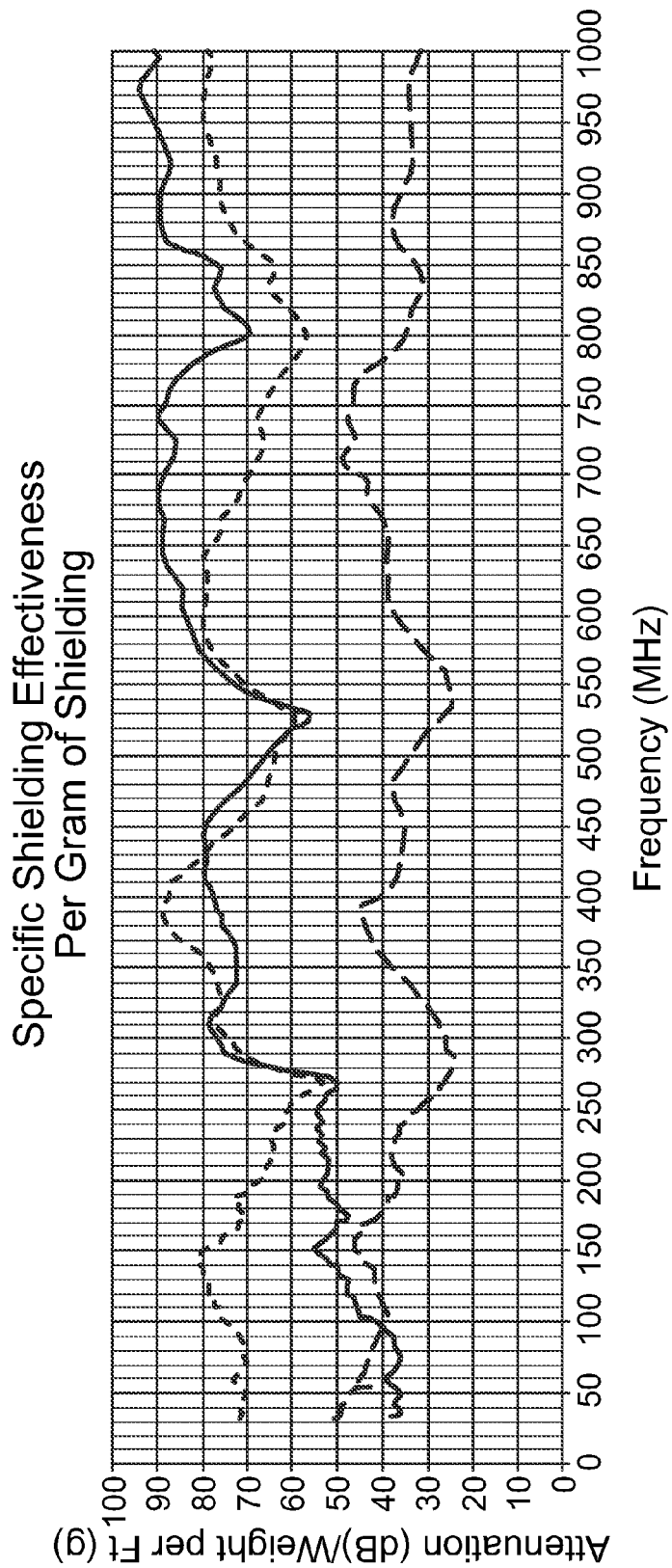
FIG. 3C is a graph of the shielding effectiveness divided by mass density of hybrid CNT shielding for three different DC cables: 1) a standard copper cable; 2) a DC cable comprising an eight-layer CNT tape component; and 3) a DC cable comprising a two-layer CNT tape component and a metallic foil component.

FIG. 3C is a graph of the specific shielding effectiveness (attenuation in decibels divided by weight per foot in grams) of hybrid CNT shielding of three different conducting 28 American Wire Gauge (AWG) twisted pairs DC cables: 1) a standard copper COTS cable with copper braid (line with long dashes); 2) a lightweight DC cable comprising an eight-layer bromine-doped CNT tape component 150 that runs parallel to and substantially along the length of the conducting cable (solid line); and 3) a lightweight DC cable comprising a two-layer bromine-doped CNT tape component 150 that runs parallel to and substantially along the length of the conducting cable and a metallic foil component comprising a single wrap of foil (line with short dashes).

FIG. 3C shows that embodiments of the invention provide significant weight savings relative to a prior art 28 AWG COTS cable, exceeding the prior art by a factor of two for certain frequencies. Accordingly, significant weight savings are available while also preserving desired shielding effectiveness throughout the relevant frequency range.

According to embodiments of the invention, the hybrid metallic foil with CNT tape provides shielding and reduced weight for a 28 AWG cable.

Figure 4A:
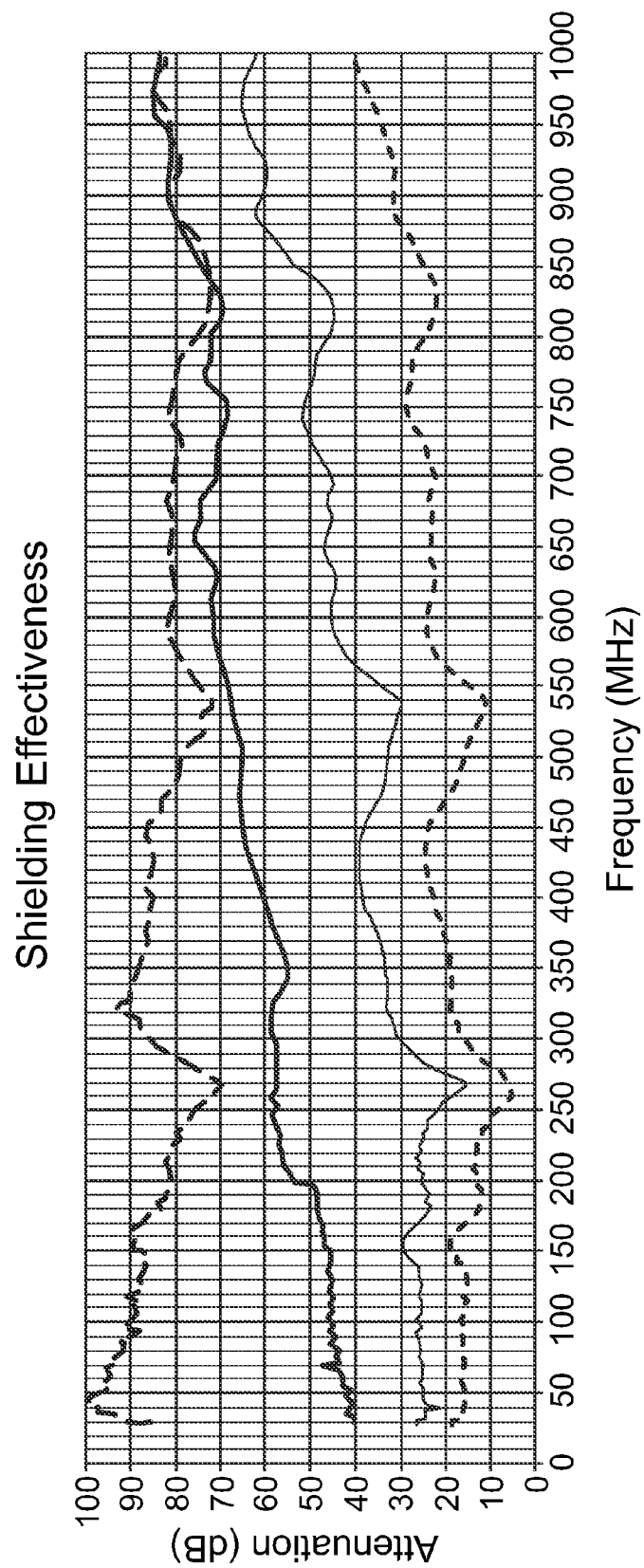
FIG. 4A is a graph of the shielding effectiveness of hybrid CNT shielding for four different coaxial cables: a standard coaxial cable; and three coaxial cables respectively comprising a two-layer CNT tape component, a six-layer CNT tape component, and a 20-layer CNT tape component.

FIG. 4A is a graph of the shielding effectiveness (attenuation in decibels) of hybrid CNT shielding for four different conducting RG400 coaxial cables: a standard coaxial cable; and three coaxial cables respectively comprising a two-layer CNT tape component, a six-layer CNT tape component, and a 20-layer CNT tape component.

More specifically, FIG. 4A is a graph of the shielding effectiveness (attenuation in decibels) of hybrid CNT shielding for the following four different conducting RG400 coaxial cables: 1) a standard prior art RG400 coaxial cable (line with long dashes); 2) a lightweight coaxial cable comprising a two-layer CNT tape component 150 (line with short dashes); 3) a lightweight coaxial cable comprising a six-layer CNT tape component 150 (light solid line); and 4) a lightweight coaxial cable comprising a 20-layer CNT tape component 150 (dark solid line). Significant weight savings are thereby available.

As shown in FIG. 4A, despite the weight savings, there are disadvantages to a design wherein the coaxial cable 100 comprises a CNT tape component 150 along the entire length of the conducting cable 100. As shown in FIG. 4A, relative to a conventional cable (line with long dashes), a cable comprising two (line with short dashes), six (light solid line), or even twenty layers (dark solid line) of a CNT tape component generally performs worse in absolute terms than a prior art COTS cable. Nevertheless, as can also be seen in FIG. 4A, regardless of the number of layers of CNT tape, a coaxial cable 100 comprising a CNT tape component 150 along its entire length experiences a shortfall in shielding effectiveness at low frequencies, for example, frequencies between approximately 50 MHz and approximately 200 MHz.

Figure 4B:
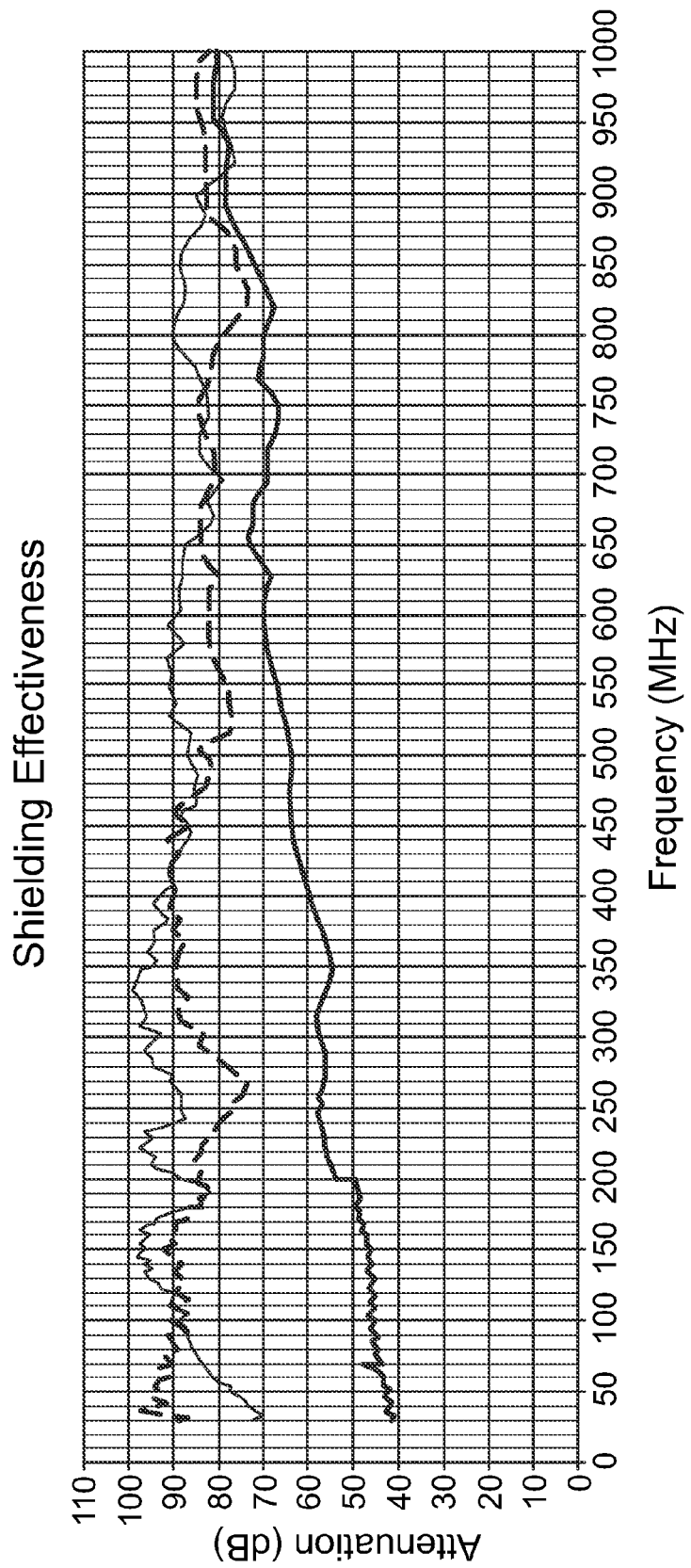
FIG. 4B is a graph of the shielding effectiveness of hybrid CNT shielding for three different conducting RG400 coaxial cables: 1) a standard RG400 coaxial cable; 2) a lightweight coaxial cable comprising a 20-layer CNT tape component; and 3) a lightweight hybrid coaxial cable comprising a 20-layer CNT tape component and a single wrap of a metallic foil component.

As shown in FIG. 4B, this shortfall at lower frequencies can be eliminated by creating a hybrid coaxial cable comprising both a CNT tape component 150 and a metallic foil component 140, according to embodiments of the invention.

FIG. 4B is a graph of the shielding effectiveness (attenuation in decibels) of hybrid CNT shielding for three different conducting COTS RG400 coaxial cables: 1) a standard COTS RG400 coaxial cable (line with long dashes); 2) a lightweight coaxial cable comprising a 20-layer CNT tape component (dark solid line); and 3) a lightweight hybrid coaxial cable comprising a 20-layer CNT tape component and a single wrap of a metallic foil component (light solid line). A single wrap of the metallic foil component 140, when combined with a 20-layer CNT tape component 150 (line with short dashes), is sufficient to significantly outperform at low frequencies embodiments comprising the 20-layer CNT tape component 150 without the metallic foil component 140 (dark solid line).

The shielding effectiveness shortfall at the lower frequencies seen in FIG. 4A is not apparent when the COTS RG400 cable comprises a single wrap of the metallic foil component 140 along with the 20-layer CNT tape component 150 (line with short dashes). The hybrid foil and CNT tape design has a shielding effectiveness equivalent to or better than the shielding effectiveness of the COTS RG400 coaxial cable. The results show that a hybrid metallic foil with CNT tape synergistically provides better shielding effectiveness than would each component separately throughout the frequency range of maximum relevance, for example, from approximately 50 MHz to approximately 1 GHz, reduced weight, and enhanced strength.

Weight is obviously a critical consideration in evaluating the performance and effectiveness of different conductors. Accordingly, the quantity known as specific shielding effectiveness provides useful information regarding shielding provided per unit weight. Specific shielding effectiveness may be defined as shielding effectiveness divided by mass density.

Figure 4C:
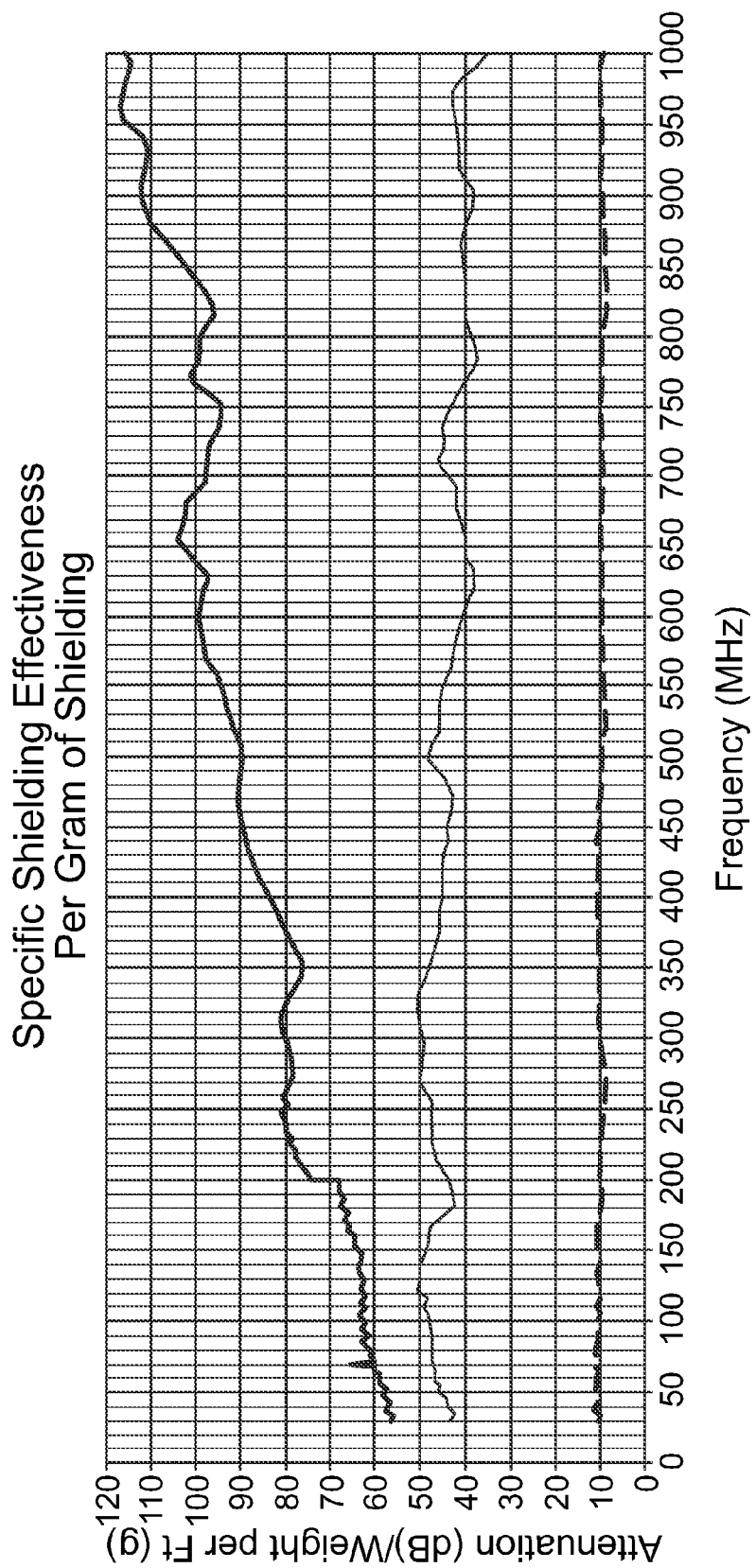
FIG. 4C is a graph of the shielding effectiveness divided by mass density of hybrid CNT shielding for three different conducting RG400 coaxial cables: 1) a standard RG400 coaxial cable; 2) a lightweight coaxial cable comprising a 20-layer CNT tape component; and 3) a lightweight hybrid coaxial cable comprising a 20-layer CNT tape component and a single wrap of a metallic foil component.

FIG. 4C is a graph of the specific shielding effectiveness (attenuation in decibels divided by weight per foot in grams) of hybrid CNT shielding for three different conducting COTS RG400 coaxial cables: 1) a standard COTS RG400 coaxial cable (dashed line); 2) a lightweight coaxial cable comprising a 20-layer CNT tape component (dark solid line); and 3) a lightweight hybrid coaxial cable comprising a 20-layer CNT tape component and a single wrap of a metallic foil component (light solid line).

FIG. 4C shows that embodiments of the invention provide significant weight savings relative to a prior art COTS RG400 cable, exceeding the prior art by a factor of two for certain frequencies and even approaching a factor of three at high frequencies. Accordingly, significant weight savings are available while also preserving desired shielding effectiveness throughout the relevant frequency range.

According to embodiments of the invention, the hybrid metallic foil with CNT tape provides shielding and reduced weight for a 28 AWG cable.

Figure 5:
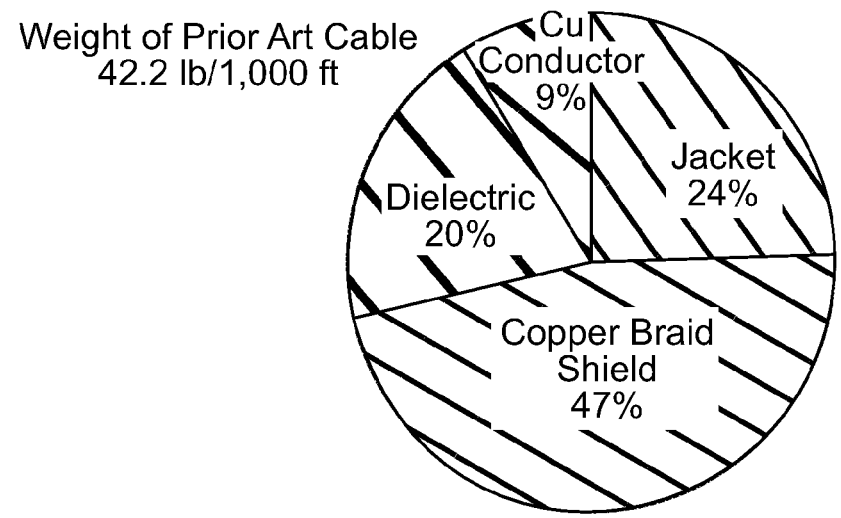
FIG. 5 is a set of two pie charts illustrating the respective component and total weights of standard cables and of hybrid cables comprising hybrid CNT shielding according to embodiments of the invention.
Figure 5:
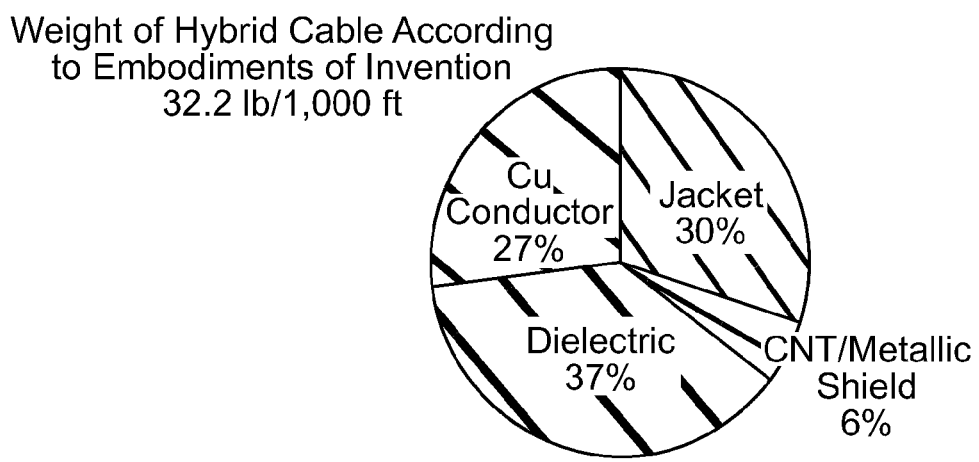

FIG. 5 is a set of two pie charts illustrating the respective weights of components and total weights for standard cables and for hybrid cables comprising hybrid CNT shielding according to embodiments of the invention.

A standard RG400 coaxial cable weighs 42.2 pounds per thousand feet of cable. This weight is roughly allocated as follows: copper braid shield 47%, jacket 24%, dielectric 20%, and copper conductor 9%.

By contrast, a hybrid RG400 coaxial cable according to embodiments of the invention weighs 13.2 pounds per thousand feet of cable, providing a weight savings relative to standard RG400 coaxial cable of 29 pounds per thousand feet of cable. The substantial weight savings is approximately 67% of the weight of the standard RG400 coaxial cable. The weight of the hybrid RG400 coaxial cable is roughly allocated as follows: 37% dielectric, 30% jacket, 27% copper conductor, and 6% to the CNT/metallic shield.

Until now, termination has been a serious problem with a carbon nanotube tape. While the CNT materials have very good electrical and flexural properties, the crimping capability of a carbon nanotube tape is typically inferior to that of a copper braid. For example, a crimp SMA connector is generally utilized for termination on an RG-316 coaxial cable. In this case, the connector is crimped over both braided metal shields.

Termination for a DC cable according to embodiments of the invention uses conventional termination procedures according to which DC wires are terminated into standard D connectors. The shield, whether it is a metallic braid or a CNT tape, can be assembled into the D connector using a conductive epoxy adhesive. No crimping is required.

Termination is less straightforward for the coaxial case. FIGS. 6A-6G are a set of illustrations showing successive stages in the sequence of terminating a coaxial cable comprising hybrid CNT shielding with an internal reinforcing member using a subminiature version A (SMA) terminator.

Figure 6A:
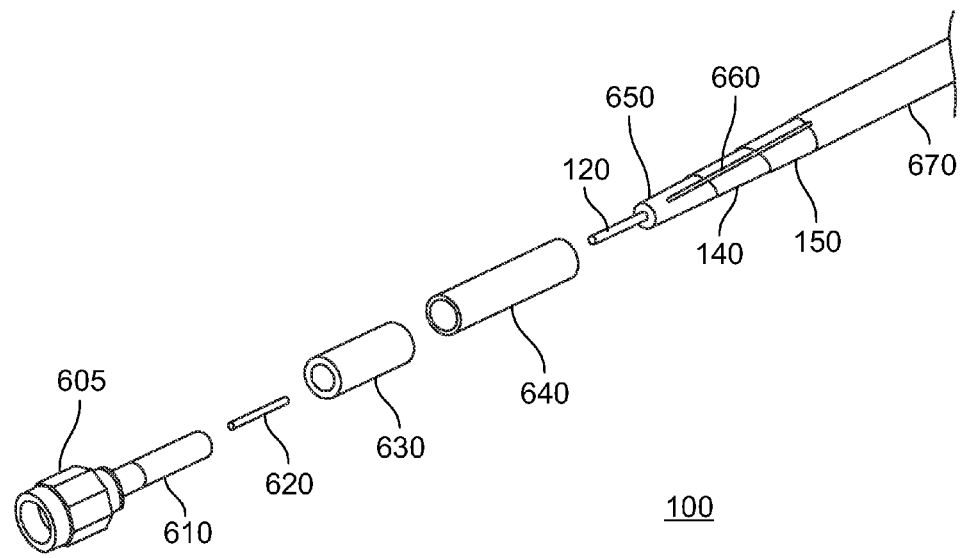

In FIG. 6A, the separate components of the coaxial cable 100 comprising hybrid CNT shielding are shown in an exploded view. Visible from left to right are SMA connector 605, which in this example is provided in one piece that also comprises ferrule 610; SMA pin 620; crimp barrel 630; heat shrink sleeve 640; one or more conductors 120; dielectric 650; staycord 660; metallic foil component 140; CNT tape component 150; and jacket insulation 670.

Figure 6B:
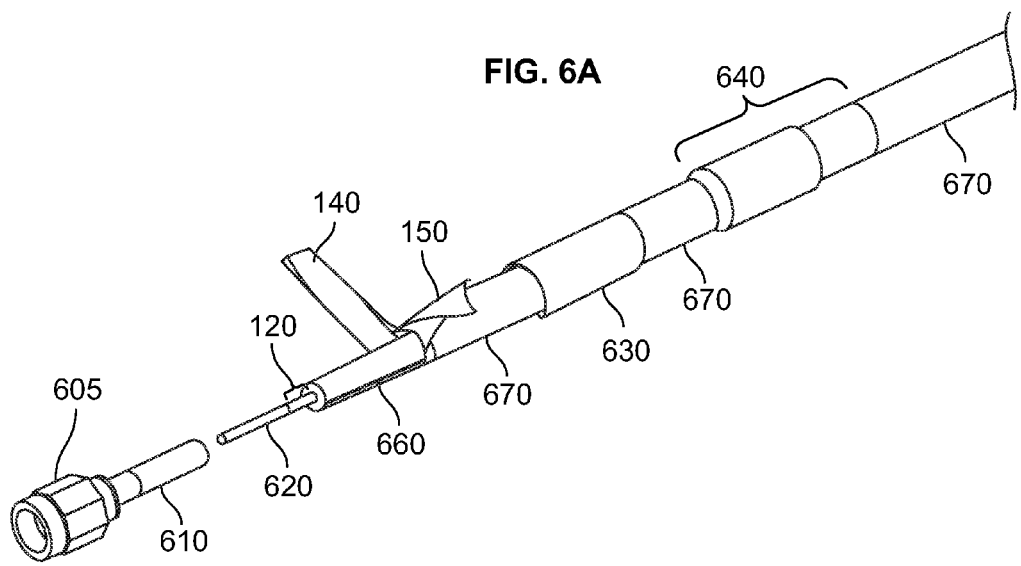

In FIG. 6B, the separate components of the coaxial cable 100 comprising hybrid CNT shielding are shown in a partially assembled view. Still separate from the remainder of the components is the SMA connector 605 and ferrule 610. The SMA pin 620 is soldered to the left end of the one or more conductors 120. The dielectric 650 is placed over the conductor near where the SMA pin 620 terminates. The metallic foil component 140 is wrapped around the dielectric 650. The CNT tape component 150 is wrapped around the dielectric 650. The jacket insulation 670 is placed over the dielectric 650. The crimp barrel 630 is placed over the jacket insulation 670 in the approximate middle of the hybrid shielding coaxial cable 100. The heat shrink sleeve 640 is placed over the jacket insulation 670 near the end of the hybrid shielding coaxial cable 100 that is opposite the SMA pin 620.

Figure 6C:
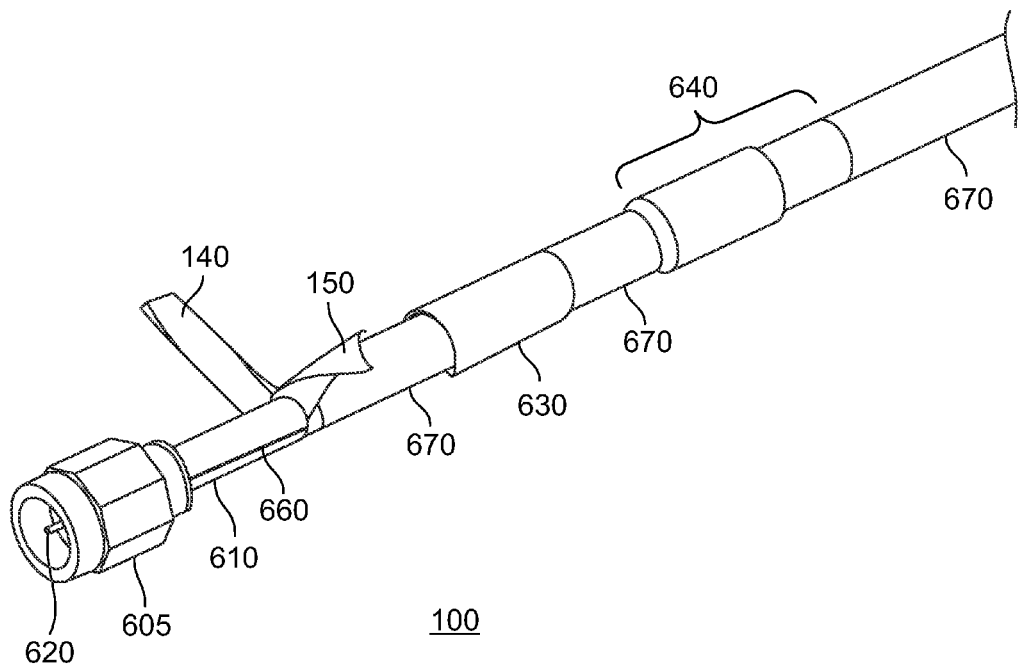

In FIG. 6C, the separate components of the coaxial cable 100 comprising hybrid CNT shielding are shown in a view of a next stage of assembly. The SMA connector 605 and ferrule 610 have been placed over the one or more conductors 120 and over the dielectric 650, which accordingly are not visible in this figure. The SMA pin 620 is attached to the left end of the one or more conductors 120 and is visible where it protrudes from the SMA connector 605. The metallic foil component 140 is wrapped over the ferrule 610. The CNT tape component 150 is wrapped over the ferrule 610.

Alternatively, the ferrule 610 can cover the metallic foil component 140. Alternatively, the ferrule 610 can cover the CNT tape component 150. The jacket insulation 670 is placed over the metallic foil component 140, and over the CNT tape component 150. The crimp barrel 630 is visible after being placed over the jacket insulation 670 in the approximate middle of the hybrid shielding coaxial cable 100. The heat shrink sleeve 640 is visible after being placed over the jacket insulation 670 near the end of the hybrid shielding coaxial cable 100 that is opposite the SMA pin 620.

Figure 6D:
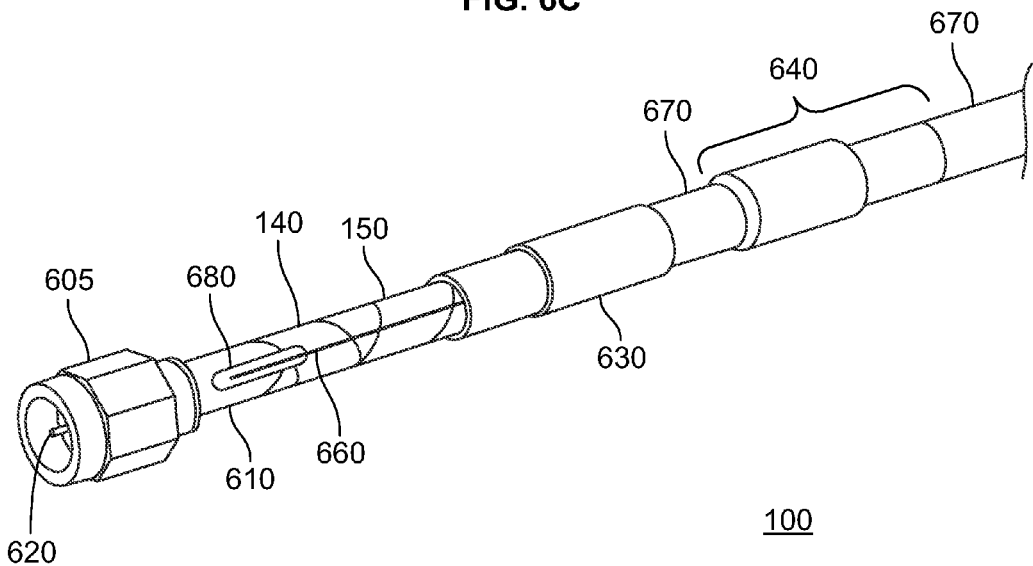

In FIG. 6D, the separate components of the coaxial cable 100 comprising hybrid CNT shielding are shown in a view of a next stage of assembly. The staycord 660 is held in place by an adhesive 680. Also visible are the SMA pin 620, the SMA connector 605 and ferrule 610, the metallic foil component 140, the CNT tape component 150, the crimp barrel 630, and the jacket insulation 670.

In FIG. 6E, the separate components of the coaxial cable 100 comprising hybrid CNT shielding are shown in a view of a next stage of assembly. Visible are the SMA pin 620, the SMA connector 605, the crimp barrel 630, the staycord 660, the adhesive 680, the jacket insulation 670, and the heat shrink sleeve 640. The ferrule 610 is not visible because it is covered by the crimp barrel 630. The metallic foil component 140 and the CNT tape component 150 are not visible because they are covered by the jacket insulation 670.

Figure 6F:
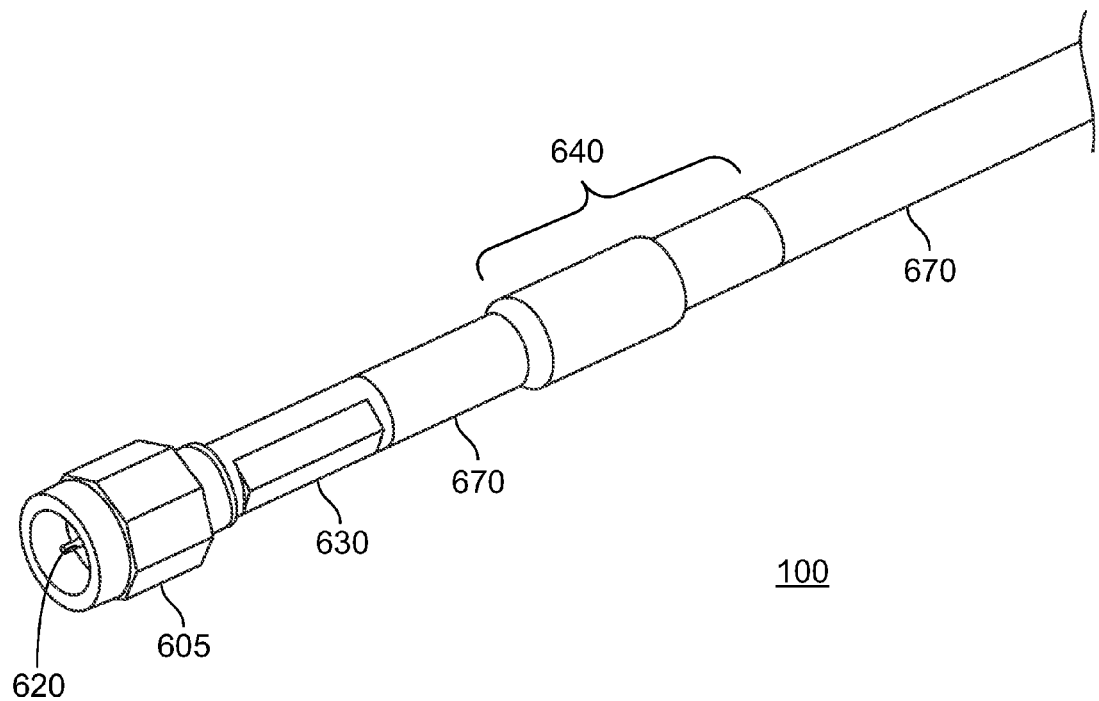

In FIG. 6F, the separate components of the coaxial cable 100 comprising hybrid CNT shielding are shown in a view of a next stage of assembly. Visible are the SMA pin 620, the SMA connector 605, the crimp barrel 630, the jacket insulation 670, and the heat shrink sleeve 640. The crimp barrel 630 is crimped in its final position so as to hold it tightly over the ferrule 610 (not shown). The staycord 660 and the adhesive 680 are not visible in this figure because they are covered by the jacket insulation 670.

Figure 6G:
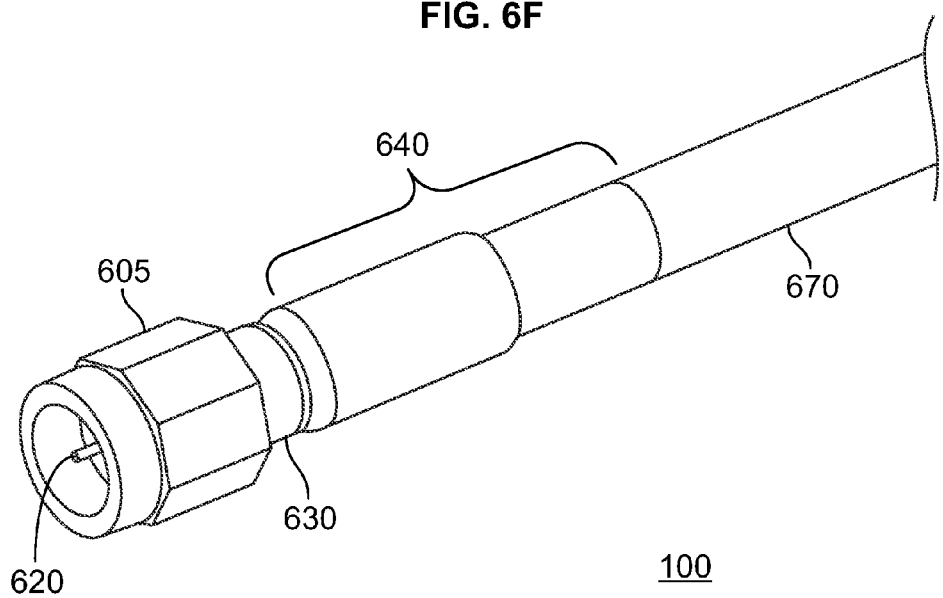

In FIG. 6G, the separate components of the coaxial cable 100 comprising hybrid CNT shielding are shown in after completion of assembly. Visible are the SMA pin 620, the SMA connector 605, the crimp barrel 630, the heat shrink sleeve 640, and the jacket insulation 670.

According to an alternative set of embodiments of the invention, a termination method can comprise soldering the metallic foil component 140 and performing one of bonding the CNT tape component 150 using a conductive adhesive and metallizing the CNT tape component 150 and then soldering it without crimping it.

FIG. 7 is a flowchart of a method 700 for making a coaxial cable comprising hybrid CNT shielding. The order of the steps in the method 700 is not constrained to that shown in FIG. 7 or described in the following discussion. Several of the steps could occur in a different order without affecting the final result.

In block 710, a coaxial cable is provided. Block 710 then transfers control to block 720.

In block 720, at least one insulating layer is coated on the coaxial cable. Block 720 then transfers control to block 730.

In block 730, a metallic foil component is placed so as to surround the at least one insulating layer. Block 730 then transfers control to block 740.

In block 740, a shielding CNT tape component is placed so as to surround the metallic foil component. Block 740 then transfers control to block 750.

In block 750, a reinforcing member is wrapped around at least one of the metallic foil component and the CNT tape component. Block 750 then transfers control to block 760.

In block 760, a connector is crimped over at least one of the CNT tape component and the metallic foil component so as to terminate the cable. Block 760 then transfers control to block 770.

In block 770, a glue is placed under the crimp to hold in place at least one of the reinforcing member, the metallic foil, and the CNT tape. Block 770 then terminates the process.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain fabrication steps and certain components can be altered without substantially impairing the functioning of the invention.

For example, the CNT tape component could be placed under the metallic foil layer. As another example, the CNT tape component could run the majority of but not the entire length of the cable, and the metallic foil component could run the majority of but not the entire length of the cable, with the entire length of the cable being covered by at least one of the CNT tape component and the metallic foil component.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims. Moreover, fabrication details are merely exemplary; the invention is defined by the following claims.

We claim:
1. A cable comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architecture further configured to provide greatly reduced weight, the hybrid mechanical-electrical architecture comprising:
at least one conducting wire;
at least one insulating layer covering at least one of the at least one conducting wire;
a metallic foil component configured for lower frequency shielding function; and
a CNT tape component configured for higher frequency shielding function, the CNT tape component further configured to perform a mechanical function of holding the metallic foil component in place.
2. The cable of claim 1, wherein:
a connector is crimped over at least one of the CNT tape component and the metallic foil component to terminate the cable.
3. The cable of claim 2, wherein:
the connector is a subminiature version A (SMA) connector.
4. The cable comprising hybrid CNT shielding of claim 1, wherein the CNT cable comprises one or more of a single conductive wire, a multiple conductive wire, and a coaxial cable configured for one or more of information, control, power, and data communication.
5. The cable comprising hybrid CNT shielding of claim 1, further comprising:
a reinforcing member.
6. The cable comprising hybrid CNT shielding of claim 5, wherein:
the reinforcing member substantially runs the full length of the cable.
7. The cable comprising hybrid CNT shielding of claim 5, wherein:
the reinforcing member comprises a staycord.
8. The cable comprising hybrid CNT shielding of claim 5, wherein:
the reinforcing member comprises metallic braid/strand or metallic coated braid/strand.
9. The cable comprising hybrid CNT shielding of claim 8, wherein:
a connector is crimped over the CNT tape component and the metallic foil component to terminate the cable.
10. The cable comprising hybrid CNT shielding of claim 8, wherein: a connector is soldered to the foil and/or soldered to a CNT tape that has been metalized for soldering, then crimped to terminate the cable.
11. The cable comprising hybrid CNT shielding of claim 9, wherein:
the connector is a subminiature version A (SMA) connector.
12. The cable comprising hybrid CNT shielding of claim 9, wherein:
a glue is placed under the crimp to hold in place at least one of the reinforcing member, the metallic foil, and the CNT tape.
13. The cable comprising hybrid CNT shielding of claim 12, wherein:
the glue is epoxy.
14. The cable comprising hybrid CNT shielding of claim 12, wherein:
the glue is silver-loaded epoxy.
15. The cable comprising hybrid CNT shielding of claim 1, wherein:
the shielding effectiveness of the cable comprising hybrid CNT shielding exceeds the shielding effectiveness offered by the CNT tape alone.
16. The cable comprising hybrid CNT shielding of claim 1, wherein:
the shielding effectiveness of the cable comprising hybrid CNT shielding exceeds the shielding effectiveness of the metallic foil component alone.
17. The cable comprising hybrid CNT shielding of claim 1, wherein:
the cable comprising hybrid CNT shielding has superior specific shielding effectiveness relative to conventional conducting cable.
18. The cable comprising hybrid CNT shielding of claim 1, wherein:
the cable comprising hybrid CNT shielding has substantially a lower weight per unit length relative to conventional conducting cable.
19. The cable comprising hybrid CNT shielding recited in claim 1, wherein the cable comprising hybrid CNT shielding further comprises a conducting wire, an insulating layer applied directly upon the conducting wire; and a reinforcing member wrapping at least one of the metallic foil component and the CNT tape component, wherein at least one of the metallic foil component and the CNT tape component are coated upon the insulating layer.
20. A coaxial cable, comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architecture further configured to provide greatly reduced weight, the hybrid mechanical-electrical architecture comprising:
at least one coaxial cable;
at least one insulating layer covering at least one of the at least one coaxial cable;
a metallic foil component configured for lower frequency shielding function;
a CNT tape component configured for higher frequency shielding function;
a reinforcing member; and
a subminiature version A (SMA) connector crimped over at least one of the CNT tape component and the metallic foil component to terminate the cable, wherein
silver-loaded epoxy is placed under the crimp to hold in place at least one of the reinforcing member, the metallic foil component, and the CNT tape component, the CNT tape component further configured to perform a mechanical function of holding the metallic foil component in place.
21. A cable comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architec- ture further configured to provide greatly reduced weight, the hybrid mechanical-electrical architecture comprising:
at least one conducting wire;
at least one insulating layer covering at least one of the at least one conducting wire;
a metallic foil component configured for lower frequency shielding function surrounding the at least one insulating layer;
a CNT tape component layer configured for higher frequency shielding function surrounding the metallic foil component; and
a reinforcing member wrapping at least one of the metallic foil component and the CNT tape component, the CNT tape component further configured to perform a mechanical function of holding the metallic foil component in place.

22. A cable comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architecture further configured to provide greatly reduced weight, the hybrid mechanical-electrical architecture comprising:
at least one conducting wire;
at least one insulating layer covering at least one of the at least one conducting wire;
a braided conductor component configured for lower frequency shielding function; and
a CNT tape component configured for higher frequency shielding function, the CNT tape component further configured to perform a mechanical function of holding the braided conductor component in place.

23. A cable comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architecture further configured to provide greatly reduced weight, the hybrid mechanical-electrical architecture comprising:
at least one conducting wire;
at least one insulating layer covering at least one of the at least one conducting wire;
a conductive woven tape component configured for lower frequency shielding function; and
a CNT tape component configured for higher frequency shielding function, the CNT tape component further configured to perform a mechanical function of holding the woven tape component in place.

24. A cable comprising:
a hybrid mechanical-electrical architecture configured to provide better shielding effectiveness than either of the two components through a frequency range of approximately 50 megahertz (MHz) to approximately 1 Gigahertz (GHz), the hybrid mechanical-electrical architecture further configured to provide greatly reduced weight, the hybrid mechanical-electrical architecture comprising:
at least one conducting wire;
at least one insulating layer covering at least one of the at least one conducting wire;
a CNT tape component layer configured for higher frequency shielding function surrounding the at least one insulating layer;
a metallic foil component configured for lower frequency shielding function surrounding the CNT tape component layer; and
a reinforcing member wrapping at least one of the metallic foil component and the CNT tape component, the CNT tape component further configured to perform a mechanical function of holding the metallic foil component in place.

* * * * *